US009869023B2

United States Patent
Heine-Kempkens et al.

(10) Patent No.: US 9,869,023 B2
(45) Date of Patent: Jan. 16, 2018

(54) HOLDER FOR DRILL-HEAD COATING

(75) Inventors: Claus Heine-Kempkens, Maienfeld (CH); Martin Hochschwarzer, Lustenau (AT); Michael Dietz, Triesenberg (LI)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 13/824,065

(22) PCT Filed: Dec. 15, 2011

(86) PCT No.: PCT/EP2011/006321
§ 371 (c)(1),
(2), (4) Date: Jun. 6, 2013

(87) PCT Pub. No.: WO2012/089306
PCT Pub. Date: Jul. 5, 2012

(65) Prior Publication Data
US 2013/0264169 A1 Oct. 10, 2013

(30) Foreign Application Priority Data

Dec. 28, 2010 (DE) .................. 10 2010 056 157

(51) Int. Cl.
*C23C 14/50* (2006.01)
*C23C 14/04* (2006.01)
(Continued)

(52) U.S. Cl.
CPC ............ *C23C 16/458* (2013.01); *B05C 13/02* (2013.01); *C23C 14/04* (2013.01); *C23C 14/50* (2013.01);
(Continued)

(58) Field of Classification Search
CPC ..... C23C 14/50; C23C 14/505; C23C 14/042; C23C 16/458; C23C 14/04; C21D 9/22
See application file for complete search history.

(56) References Cited

U.S. PATENT DOCUMENTS 4,528,208 A * 7/1985 Hirvonen ............... B23Q 3/086
118/500
5,688,389 A * 11/1997 Bjornard ............... C23C 14/042
118/500
(Continued)

FOREIGN PATENT DOCUMENTS

CN 100529171 C 8/2009
DE 60002579 T2 4/2004
(Continued)

OTHER PUBLICATIONS

International Search Report for application PCT/EP2011/006321 dated Feb. 6, 2012.

*Primary Examiner* — Thomas Randazzo
(74) *Attorney, Agent, or Firm* — Pearne & Gordon LLP

(57) ABSTRACT

The present invention relates to a holder for a number of drills, which can advantageously be used for coating drill tips. The holders according to the invention make it possible to arrange the drills in the coating unit in such a way that their tips rest on a cylindrical wall and these can be rotated past a coating source at the same minimum distance. The holder comprises a first curved wall with holes, a second curved wall with holes or slits and a third wall which serves as stop for drills inserted in the holes of the first and second wall.

17 Claims, 4 Drawing Sheets

(51) Int. Cl.
*C23C 16/458* (2006.01)
*F27D 5/00* (2006.01)
*B05C 13/02* (2006.01)
*C21D 9/00* (2006.01)

(52) U.S. Cl.
CPC ............ *C23C 14/505* (2013.01); *F27D 5/005* (2013.01); *C21D 9/0025* (2013.01)

(56) References Cited

U.S. PATENT DOCUMENTS

| | | | | |
|---|---|---|---|---|
| 5,750,207 A | * | 5/1998 | Hammond | C23C 14/0036 118/500 |
| 5,753,092 A | * | 5/1998 | Hollars | C23C 14/50 118/719 |
| 6,406,601 B1 | * | 6/2002 | Kim | C23C 14/022 204/298.12 |
| 6,866,889 B1 | * | 3/2005 | Lill | C23C 14/042 118/728 |
| 7,469,570 B2 | * | 12/2008 | Cooper | B05L 315/00 239/74 |

FOREIGN PATENT DOCUMENTS

| | | | | |
|---|---|---|---|---|
| JP | 4052274 A | | 2/1992 | |
| WO | WO 01/04375 | * | 1/2001 | ............. C23C 14/50 |
| WO | WO-0104375 A1 | * | 1/2001 | ........... C23C 14/042 |

* cited by examiner

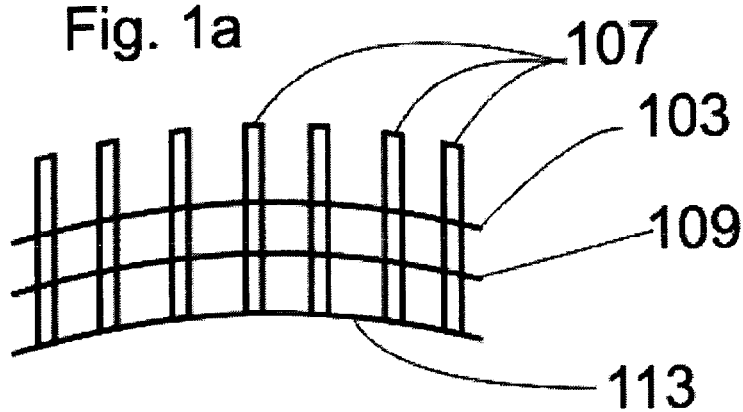
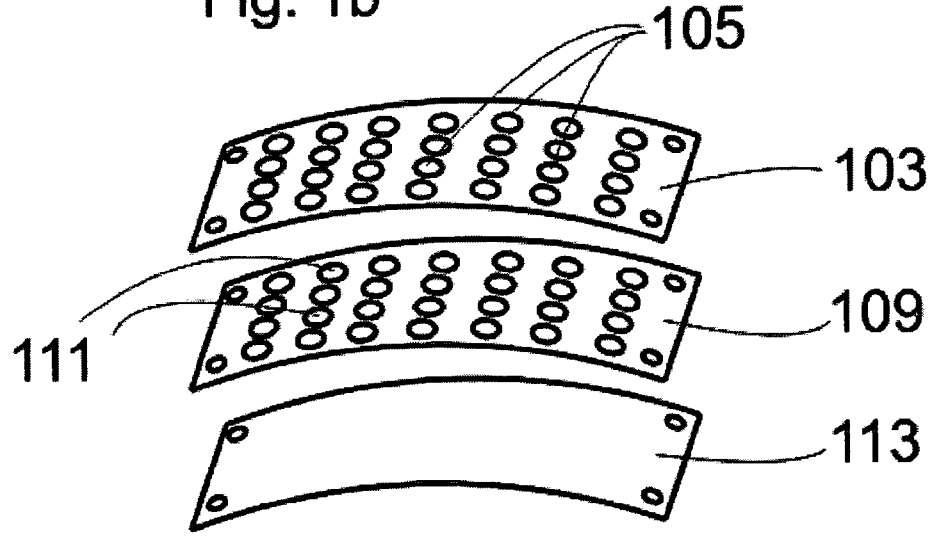

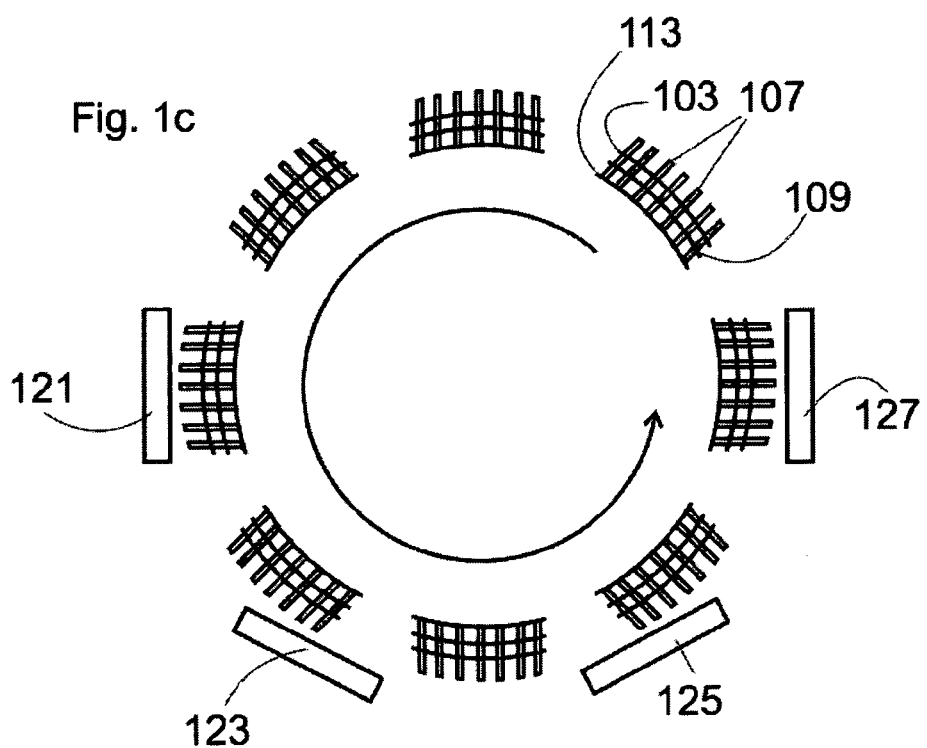
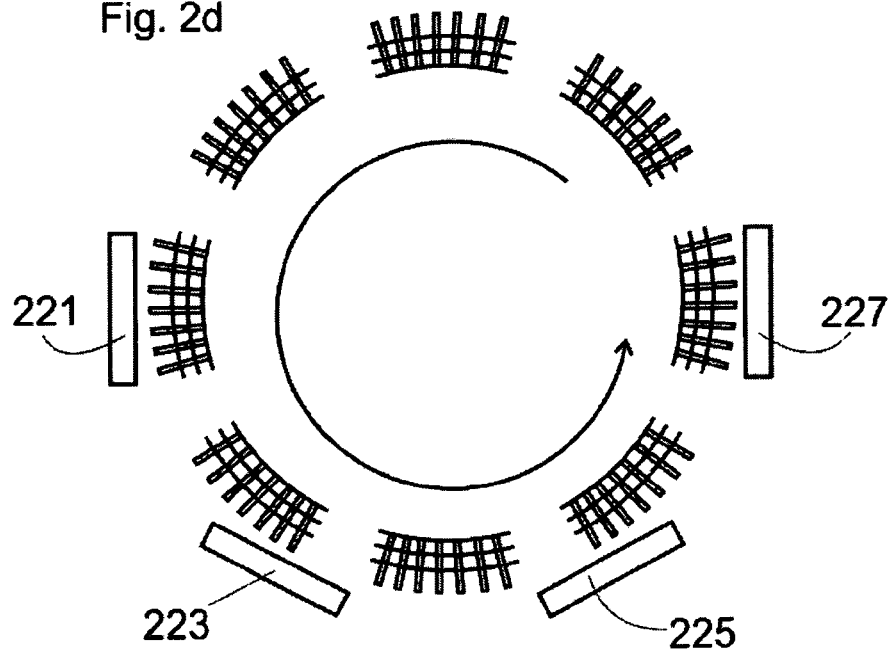

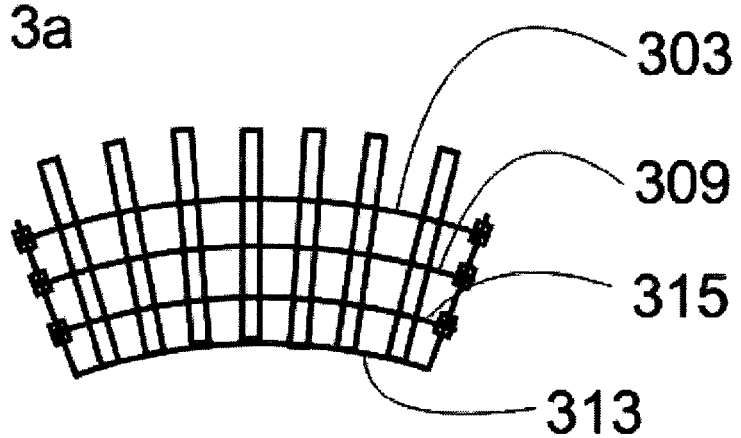
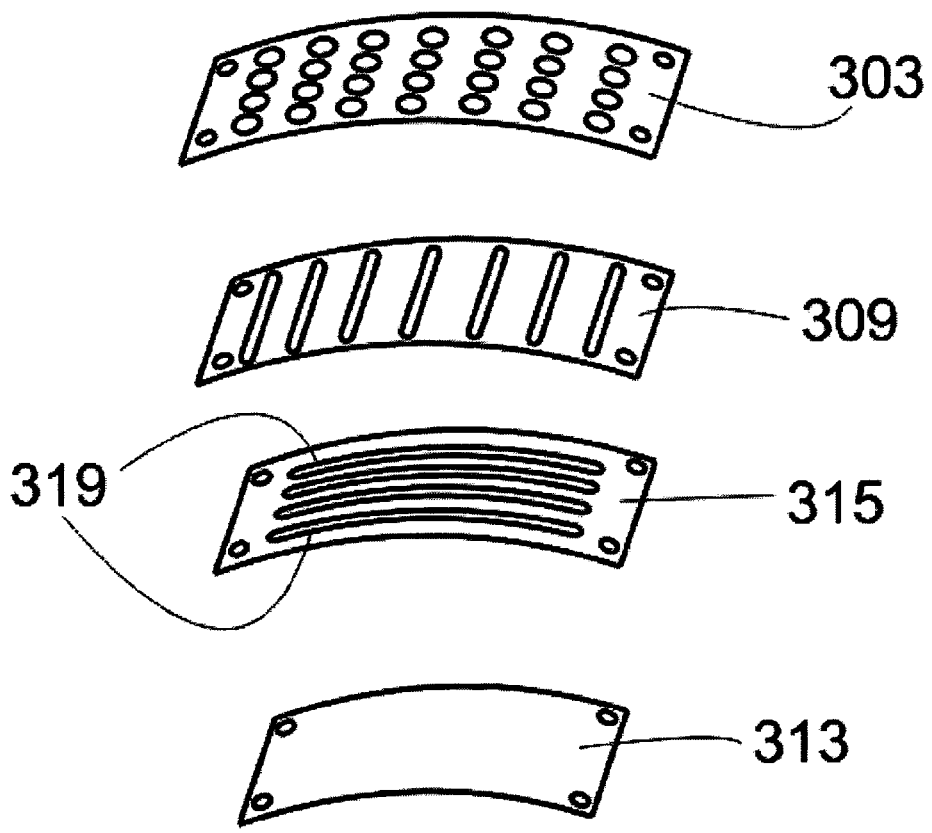

HOLDER FOR DRILL-HEAD COATING

The present invention relates to the coating of drills and to the holders that can be used for this purpose.

In order to improve the wear and tear behavior of drills, it is known to coat their tips and chip flutes with layers of a hard material such as for example titanium nitride or aluminum chromium nitride. Usually, to apply the layers, PVD processes such as for example arc evaporation, electron beam evaporation or sputtering, are used in a batch process. A batch process means in this connection that holders with the drills to be coated are loaded and these holders are arranged on a kind of turntable, which by rotating ensures that the drills are presented several times to the coating source. In doing so, the attempt is made to construct the holders in such a way that only the drill heads and the area directly behind the tip are coated.

From DE 600 02 579 T2 it is known to use a holder that has at least a perforated outer wall provided with an array of openings in which the drills can be inserted. Within the inner cavity of the holder, a supporting wall parallel to the outer wall and having corresponding openings is provided, so that the drills with their shafts can be arranged essentially in parallel. Furthermore, a stop at a distance inwards from the support wall is provided in the cavity of the holder in order to ensure that the drills protrude essentially to the same extent from the outer wall. The holder in this case is constructed as a hollow holder to shield the portion of a drill within the outer wall from the external environment yet to expose them to the atmosphere in the inside of the holder.

The holder as disclosed in DE 600 02 579 T2 has however the disadvantage that it is designed in the shape of a polygon and the drills protrude during the coating from the outer surface of the polygonal shape. If therefore the drill tips rotate past the coating source, those drills that are placed close to the corners of the polygon have a reduced minimal distance to the coating source compared with those drills that lie at the center of the polygon surface. This results in an undesirable variation of the thickness of the drills' coating. Additionally, the drills that are placed close to the corners of the polygons, when they have the smallest distance to the coating source, do not stand perpendicular to the surface of the coating source. One side of the chip flute is therefore shielded, whilst the other side of the chip flute is more directly exposed to the source. Since it is at this point in time that most material is deposited onto the drill surface, it results in an undesirably asymmetric coating of these drills. A further disadvantage is that since the holder must be hollow, the flexibility of loading is considerably reduced.

It is one aim of the present invention to solve at least partly the problems described above.

According to the invention, this aim is solved in that the holder is not executed as a hollow holder but as a sandwich of at least three walls at a distance to one another, wherein the walls are curved in such a way that when arranging the holder onto the turntable, the curve is substantially adapted to the contour of the turntable. In this manner, the polygon form known from the state of the art is avoided.

The invention will now be explained in detail by way of example and on the basis of the figures.

FIG. 1a shows diagrammatically a cross section of an individual inventive holder according to a first embodiment.

FIG. 1b shows diagrammatically the exploded view of an individual inventive holder according to the first embodiment.

FIG. 1c shows, for the first embodiment, the inventive holders as they would have to be arranged in a coating facility. The figure shows the view from above on the turntable.

FIG. 2d shows a second embodiment of the inventive holders as they would have to be arranged in a coating facility. The figure shows the view from above on the turntable.

FIG. 3a shows a cross section of an individual inventive holder according to a third embodiment.

FIG. 3b shows the exploded view of an individual inventive holder according to the third embodiment.

Figure 2A:
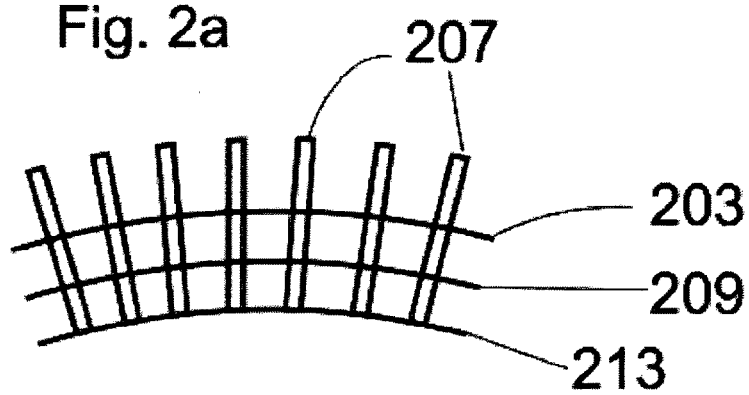
FIG. 2a shows diagrammatically a cross section of an individual inventive holder according to a second embodiment.
Figure 2B:
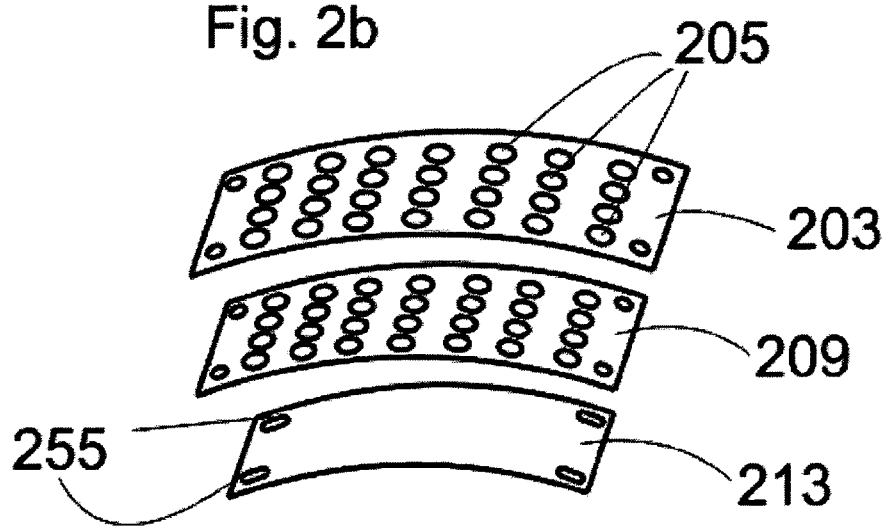
FIG. 2b shows diagrammatically the exploded view of an individual inventive holder according to the second embodiment.

The holder according to a first embodiment comprises a first wall 103 curved along a segment of circle and perforated with an array of holes 105, into which the drills 107 can be inserted. It furthermore includes a second curved and perforated wall 109 with holes 111, whose curve corresponds essentially to the curve of the first wall 103 and whose holders 111 have been placed essentially to correspond with the holes 105 of the first wall 103. The second wall 109 is placed at a distance from the first wall 103 on its concave side. The holder includes a third curved wall 113 again arranged at a distance from the second wall 109 on its concave side but which has no holes corresponding to the holes of the first and second walls. A corresponding holder is illustrated diagrammatically in FIG. 1a in cross section and diagrammatically in FIG. 1b in an exploded view.

FIG. 1c shows how corresponding holders can be placed in the coating facility. The figure shows the inventive holders placed in a circle and surrounded for example by four coating sources 121, 123, 125 and 127, past which they rotate. This clearly shows that the curves of the holders must be adapted to the size of the coating facility. The curve radius of the holders therefore lies between 0.2 m for small coating facilities and 3 m for large coating facilities. FIG. 1c also clearly shows that each of the drills rotates past the coating source at the same minimum distance. It also becomes clear that with this first embodiment of the present invention, the problem of the asymmetrical coating of the chip flutes has not yet been solved.

This problem is solved with the second embodiment of the present invention, which is thus a preferred embodiment. The holder according to the second embodiment comprises a first wall 203 curved along a segment of circle and perforated with an array of holes 205, into which the drills 107 can be inserted. It furthermore includes a second wall 209 curved along a segment of circle and perforated with holes 211. The second wall 209 is placed at a distance from the first wall 203 on the concave side. The holder includes a third wall 213 curved along a segment of circle. The third wall 213 is placed at a distance from the second wall 209 on its concave side. It has no holes corresponding to the holes of the first or second wall. The curves of the three walls are chosen in such a way that, if they were to be completed, the centers of the circles would lie superimposed above one another. The holes 211 of the second wall 209 are aligned with the holes 205 of the first wall 203 in such a manner that the drills 207 are oriented essentially radially when they are loaded in the holder through the first wall 203 and the second wall 209 and finally stop against the third wall 213.

Figure 2C:
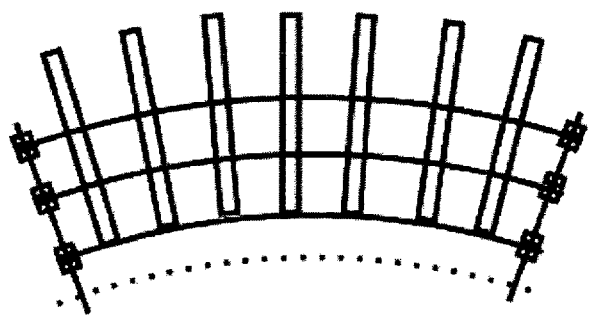
FIG. 2c shows the cross section of an individual inventive holder according to the second embodiment with variable stopper means.

FIG. 2c shows how the three walls can be connected to one another by means of braces 251, 253. In this respect, the first wall 203 is firmly connected with the second wall 209 so that the respective holes for the drills remain aligned one with another. In contrast thereto, the distance of the third wall 213 to the second wall 209 can be modified in order to be able to coat drill lengths that may vary from one batch to the next. This can be achieved for example by means of elongated holes 255. FIG. 2c illustrates a second position of the third wall 213 in a dotted line.

FIG. 2d shows diagrammatically a view from above of a coating facility in which the holders according to the just described second embodiment are placed in a ring shape. As can be seen from the figure, all drills protrude radially outwards and are presented to the coating sources with the same minimum distance.

According to a third embodiment of the present invention, as illustrated in FIGS. 3a and 3b, the holder comprises four walls. The two outer walls 303, 313 correspond to the first wall and to the third wall of the first two embodiments. Between these two outer walls 303, 313 are placed two additional walls 309, 315. The wall 309, which is placed in the vicinity of the outer wall 303, comprises slits 317 which run perpendicular to the curve of the wall 309. The wall 315, which is placed in the vicinity of the wall 313, comprises slits 319 running longitudinally along the curve of the wall. With such an arrangement, it is possible by radially sliding the wall 309 relative to the wall 303 to adjust the radial orientation of the drills. This is advantageous for example if the same holder is to be used for coating facilities with different chamber diameters.

In the described embodiments, the drill tips come to rest on a cylindrical wall when they are loaded into the holders up to the stopper means. This affords the possibility of stacking several cylinders, i.e. several holders, one on top of the other.

A holder for carrying drills in a coating facility has been disclosed, having a first wall perforated with first holes and a second wall at a distance from the first wall and perforated with second holes or slits that are aligned with the first holes in such a way that drills can be inserted each into the first holes and the same drills simultaneously into the second holes or slits, wherein the holder comprises at least a third wall at a distance from the second wall and which is suitable for serving as a stop for the drills inserted in the first and second holes or slits and wherein at least the first wall and the third wall are curved along segments of circle and thus have curves designed in such a way that after inserting the drills up to the respective stop, they protrude as a whole with the drill tip from the holder following the segment of circle of the third wall.

The second wall itself can be curved along a segment of circle. The second wall can be placed at a distance from the first wall on its concave side and the third wall can be placed at a distance from the second wall on the concave side of the first wall, wherein the second wall is placed between the first and third walls.

It is advantageous if the first, second and third wall are placed relative to one another and curved to segments of circle in such a manner that when completing the circles, the centers of the circles would essentially lie superimposed above one another.

The invention discloses a coating facility with holders as described above, wherein the holders are placed in the coating facility in such a manner that during coating, the drills can be presented to a coating source in a circular path with essentially the same minimum distance from the coating source.

A method for coating a series of drills has been disclosed, wherein the drills for coating are inserted in at least one holder rotating in a circular path and having a first wall perforated with first holes and a second wall perforated with second holes or slits, characterized in that the tips of the drills protruding from the holder essentially rest on a cylindrical wall, wherein the axes of the drills are not parallel to the rotation axis of the at least one holder and are preferably perpendicular to the cylindrical wall.

The invention claimed is:

1. Holder for carrying drills in a coating facility, having
   a first wall perforated with first holes and
   a second wall at a distance from the first wall and perforated with second holes or slits that are aligned with the first holes in such a way that drills can be inserted each into the first holes and the same drills simultaneously into the second holes or slits,
   wherein the holder comprises at least a third wall at a distance from the second wall and which is suitable for serving as a stop for the drills inserted in the first and second holes or slits and wherein at least the first wall and the third wall are curved along segments of a circle and thus have curves designed for achieving uniform coating of the drills, in such a way that after inserting the drills up to the respective stop, they protrude as a whole with the drill tip from the holder following the segment of circle of the third wall.

2. Holder according to claim 1, wherein the holder is constructed in the coating facility in such a manner that only the drill tip and the area directly behind the drill tip are coated.

3. Holder according to claim 1, wherein the first wall and the third wall are curved such that the first wall and third wall have concentric centers of curvature.

4. Holder according to claim 1, wherein the first wall, the second wall, and the third wall are curved such that the first wall, the second wall, and the third wall have concentric centers of curvature.

5. Holder according to claim 1, wherein the second wall is spaced radially inward from the first wall and the third wall is spaced radially inward from the second wall.

6. Coating facility with holders for carrying drills in a coating facility, each holder having a first wall perforated with first holes and a second wall at a distance from the first wall and perforated with second holes or slits that are aligned with the first holes in such a way that drills can be inserted each into the first holes and the same drills simultaneously into the second holes or slits, wherein the holder comprises at least a third wall at a distance from the second wall and which is suitable for serving as a stop for the drills inserted in the first and second holes or slits and wherein at least the first wall and the third wall are curved along segments of a circle and thus have curves designed in such a way that after inserting the drills up to the respective stop, they protrude as a whole with the drill tip from the holder following the segment of circle of the third wall,
   characterized in that the holders are placed in the coating facility in such a manner that during coating, the drills can be presented to a coating source in a circular path with essentially the same minimum distance from the coating source.

7. Coating facility according to claim 6, wherein the holders are constructed in the coating facility in such a manner that only the drill tip and the area directly behind the drill tip are coated.

8. Method for coating a series of drills comprising the steps of inserting the drills for coating in at least one holder and rotating the at least one holder in a circular path,
characterized in that the at least one holder comprises a first wall perforated with first holes and a second wall perforated with second holes or slits, the first wall and the second wall being curved along segments of a circle, and
characterized in that the drills are inserted in the at least one holder such that tips of the drills protrude from the holder and axes of the drills are not parallel to a rotation axis of the at least one holder.

9. Method according to claim 8, wherein the holders are constructed in the coating facility in such a manner that only the drill tip and the area directly behind the drill tip are coated.

10. Method according to claim 8, wherein the drills are inserted in the at least one holder such that tips of the drills rest on a cylindrical wall and the axes of the drills are perpendicular to the cylindrical wall.

11. Holder for carrying drills in a coating facility, having a first wall perforated with first holes and
two second walls placed at a distance from the first wall and perforated with slits that are aligned with the first holes in such a way that drills can be inserted each into the first holes and the same drills simultaneously into the slits,
wherein the holder comprises at least a third wall at a distance from the two second walls and which is suitable for serving as a stop for the drills inserted in the first holes or slits and wherein at least the first wall and the third wall are curved along segments of circle and thus have curves designed in such a way that after inserting the drills up to the respective stop, they protrude as a whole with the drill tip from the holder following the segment of circle of the third wall.

12. Holder according to claim 11, characterized in that the two second walls are placed at a distance from the first wall on its concave side and the third wall is placed at a distance from the two second walls on the concave side of the first wall, wherein the two second walls are placed between the first and third walls.

13. Holder according to claim 11, characterized in that the first wall, two second walls and third wall are placed relative to one another and curved to segments of circle in such a manner that when completing the circles, the centers of the circles essentially lie superimposed above one another.

14. Holder according to claim 11, characterized in that the slits of the two second walls are aligned with the holes of the first wall in such a manner that the drills are oriented essentially radially when they are loaded in the holder through the first wall and the two second walls and finally stop against the third wall and in this manner the drills protrude radially outwards after loading.

15. Holder according to claim 11, characterized in that the two second walls are also curved along a segment of circle.

16. Holder according to claim 15, wherein the first holes of the first wall and second holes or slits of the two second walls are aligned to orient the drills in a radial direction when the drills are inserted in the first holes of the first wall and second holes or slits of the two second walls.

17. Holder for carrying drills in a coating facility, having a first wall perforated with first holes and
two inner walls comprising a first inner wall with first slits, and a second inner wall with second slits, the first and second slits in a non-parallel relationship relative to one another, and the two inner walls placed at a distance from the first wall and aligned with the first holes in such a way that drills can be inserted each into the first holes and the same drills simultaneously into the slits,
wherein the holder comprises at least a third wall at a distance from the two inner walls and which is suitable for serving as a stop for the drills inserted in the first holes or first and second slits and wherein at least the first wall and the third wall are curved along segments of circle and thus have curves designed in such a way that after inserting the drills up to the respective stop, they protrude as a whole with the drill tip from the holder following the segment of circle of the third wall.

* * * * *